US012621219B2

(12) United States Patent
Watanabe

(10) Patent No.: US 12,621,219 B2
(45) Date of Patent: May 5, 2026

(54) CONTROL APPARATUS, CONTROL METHOD, STORAGE MEDIUM, CONTROL SYSTEM, LITHOGRAPHY APPARATUS, AND METHOD OF MANUFACTURING ARTICLE

(71) Applicant: CANON KABUSHIKI KAISHA, Tokyo (JP)

(72) Inventor: Yasuhiro Watanabe, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 71 days.

(21) Appl. No.: 18/732,800

(22) Filed: Jun. 4, 2024

(65) Prior Publication Data

US 2024/0422076 A1 Dec. 19, 2024

(30) Foreign Application Priority Data

Jun. 19, 2023 (JP) ................................. 2023-100268

(51) Int. Cl.
| | |
|---|---|
| *H04L 41/00* | (2022.01) |
| *G03F 7/00* | (2006.01) |
| *H04L 12/28* | (2006.01) |
| *H04L 41/06* | (2022.01) |
| *H04L 43/08* | (2022.01) |

(52) U.S. Cl.
CPC .......... *H04L 41/24* (2013.01); *G03F 7/70508* (2013.01); *H04L 12/28* (2013.01); *H04L 41/06* (2013.01); *H04L 43/08* (2013.01)

(58) Field of Classification Search
None
See application file for complete search history.

(56) References Cited

U.S. PATENT DOCUMENTS

| | | | | |
|---|---|---|---|---|
| 9,813,288 | B2 * | 11/2017 | Koide | ..................... H04L 41/12 |
| 10,063,420 | B2 * | 8/2018 | Morimoto | ............. H04L 43/026 |
| 10,999,367 | B2 | 5/2021 | Yoneda et al. | |
| 2009/0016280 | A1 * | 1/2009 | Iyer | ................... H04W 74/0816 370/329 |
| 2014/0334341 | A1 * | 11/2014 | Balasubramanian | ... H04L 12/28 370/254 |

(Continued)

FOREIGN PATENT DOCUMENTS

| | | | | | |
|---|---|---|---|---|---|
| JP | WO1999017500 | A1 * | 9/1998 | ............. | H04L 12/28 |
| JP | 5141169 | B2 * | 2/2013 | | |

(Continued)

*Primary Examiner* — Phyllis A Book

(74) *Attorney, Agent, or Firm* — ROSSI, KIMMS & McDOWELL LLP

(57) ABSTRACT

A control apparatus for controlling a plurality of nodes connected to a network is provided. The apparatus includes a communication unit configured to transmit/receive, via the network in a predetermined period, a data frame including a plurality of data areas respectively assigned to the nodes; and a setting unit configured to, in a case where a first data area, of the plurality of data areas, which is scheduled as a data area of a first node is unused in a first period, assign the first data area as a data area of a second node different from the first node in the first period. The communication unit is configured to cause the second node to read out, in the first period, response data written in the first data area.

13 Claims, 16 Drawing Sheets

(56)                References Cited

U.S. PATENT DOCUMENTS

| | | | |
|---|---|---|---|
| 2015/0249600 A1* | 9/2015 | Numata | .................. H04L 45/64 |
| | | | 370/389 |
| 2019/0044818 A1* | 2/2019 | Nolan | ................... H04W 8/005 |
| 2019/0104519 A1* | 4/2019 | Sydir | ...................... H04L 41/12 |
| 2021/0194959 A1* | 6/2021 | Ogawa | ................. G06F 3/0649 |
| 2023/0296988 A1 | 9/2023 | Watanabe | |
| 2024/0273278 A1* | 8/2024 | Van Hertum | ....... G03F 7/70975 |

FOREIGN PATENT DOCUMENTS

| | | |
|---|---|---|
| JP | 2018064245 A | 4/2018 |
| JP | 2022108621 A | 7/2022 |
| WO | 2018105047 A1 | 6/2018 |

* cited by examiner

F I G. 1

F I G. 4
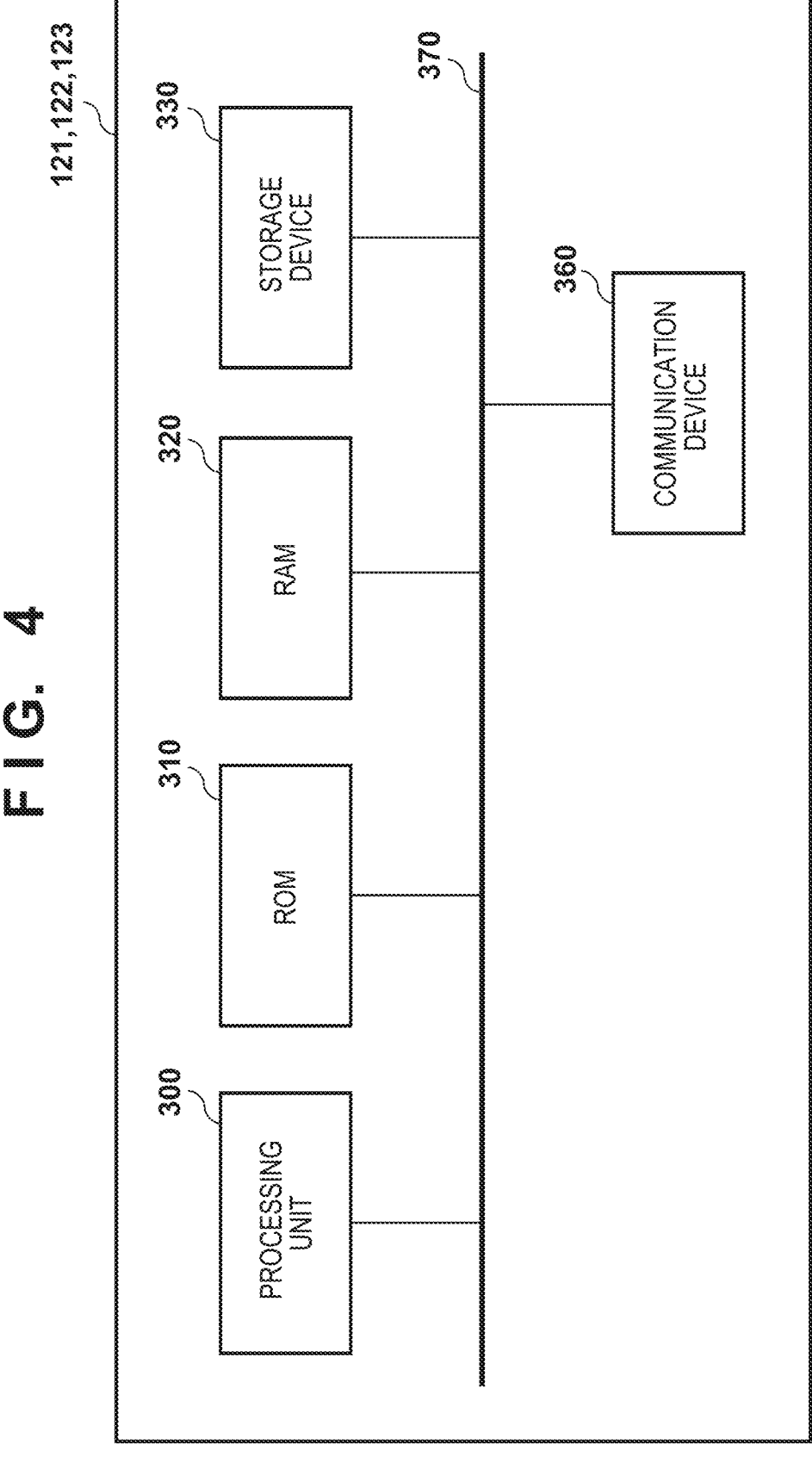

F I G. 5
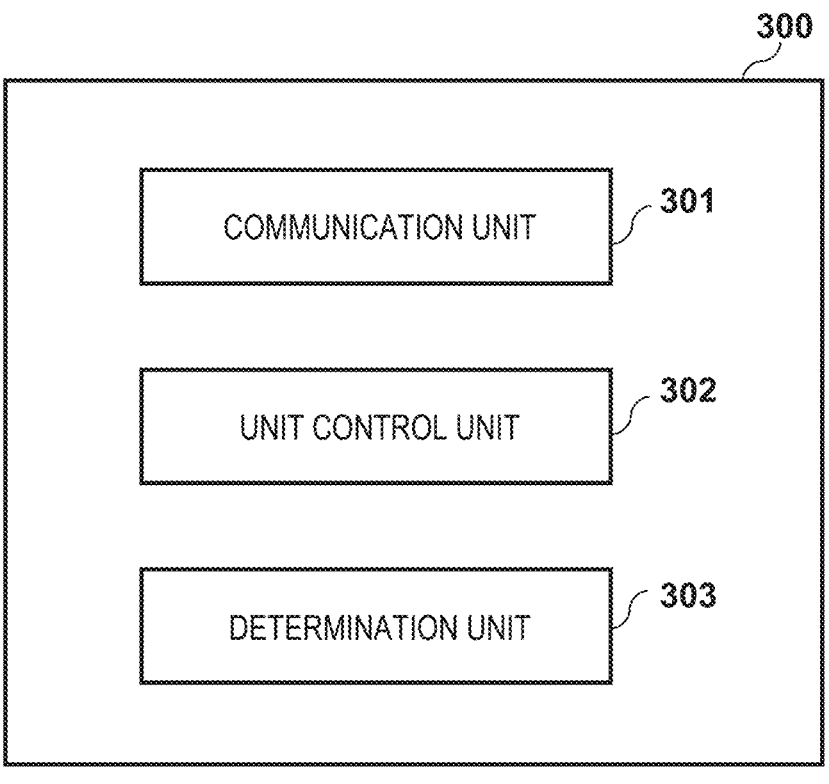

F I G. 6
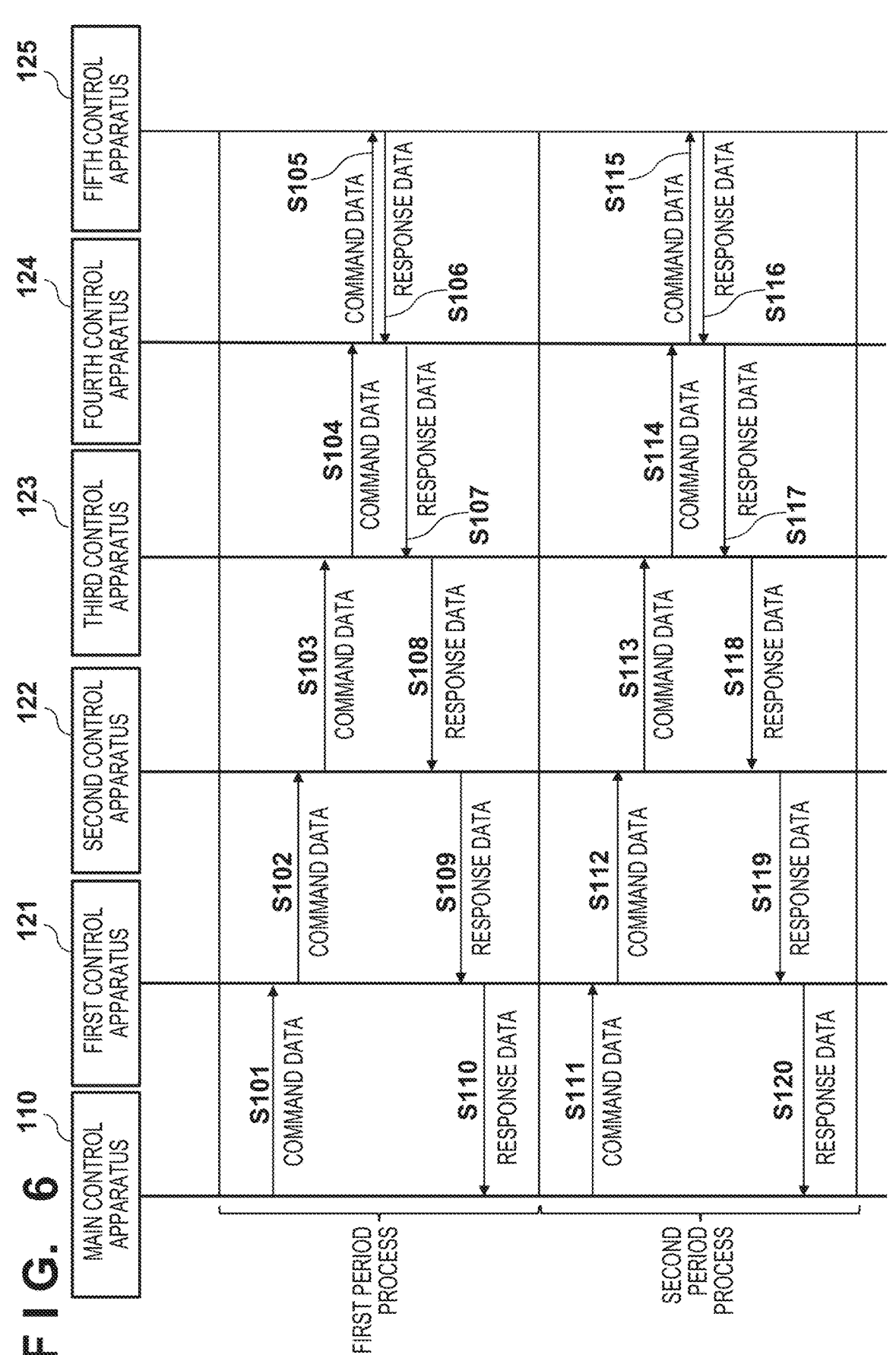

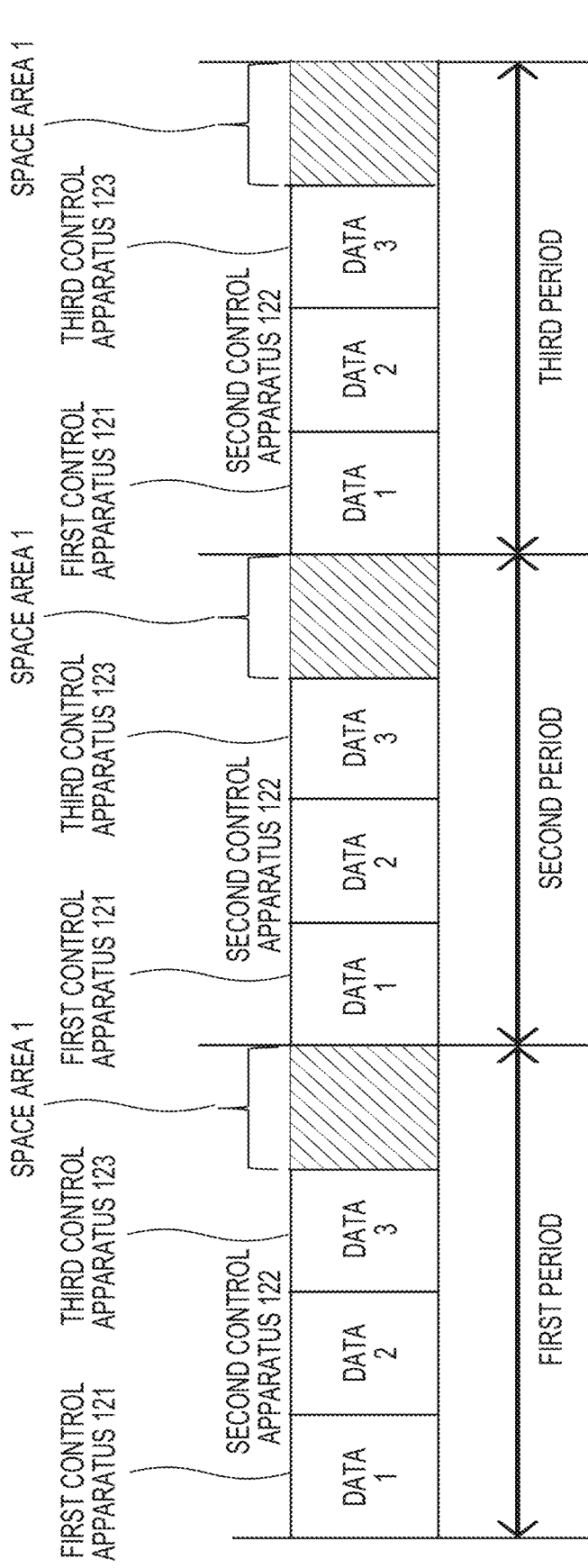
F I G. 7

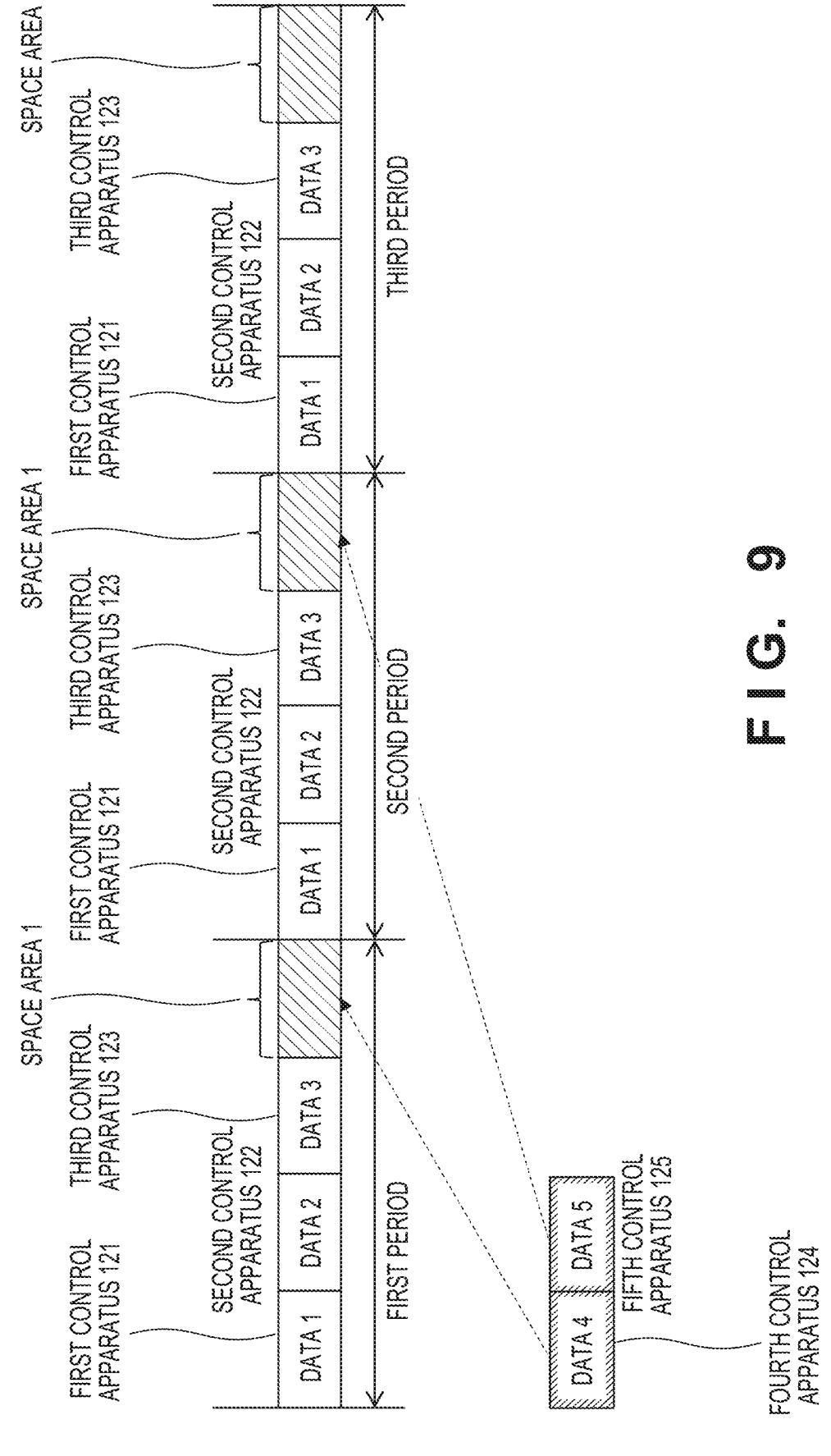
F I G.   9

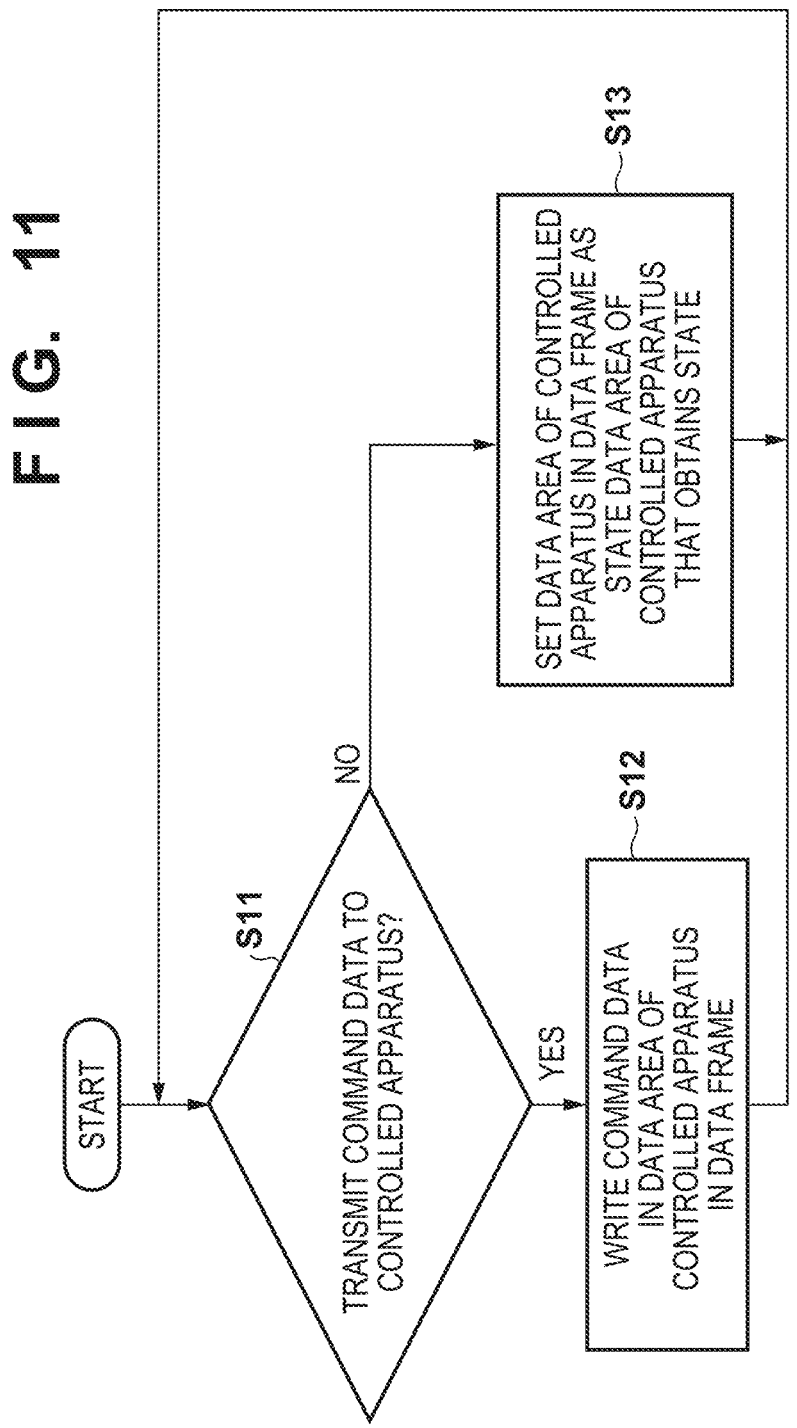
F I G. 11

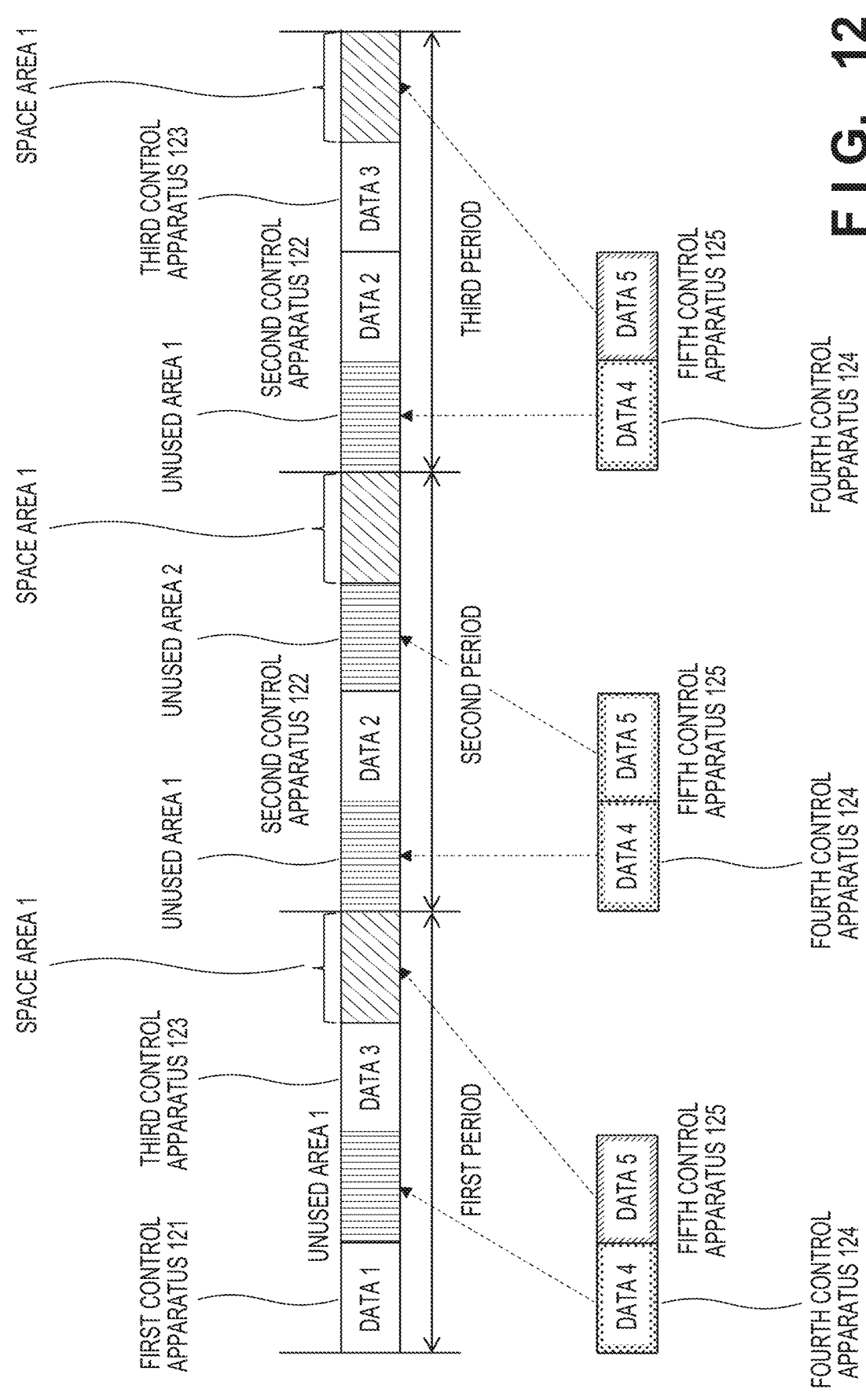
F I G.  12

F I G. 13
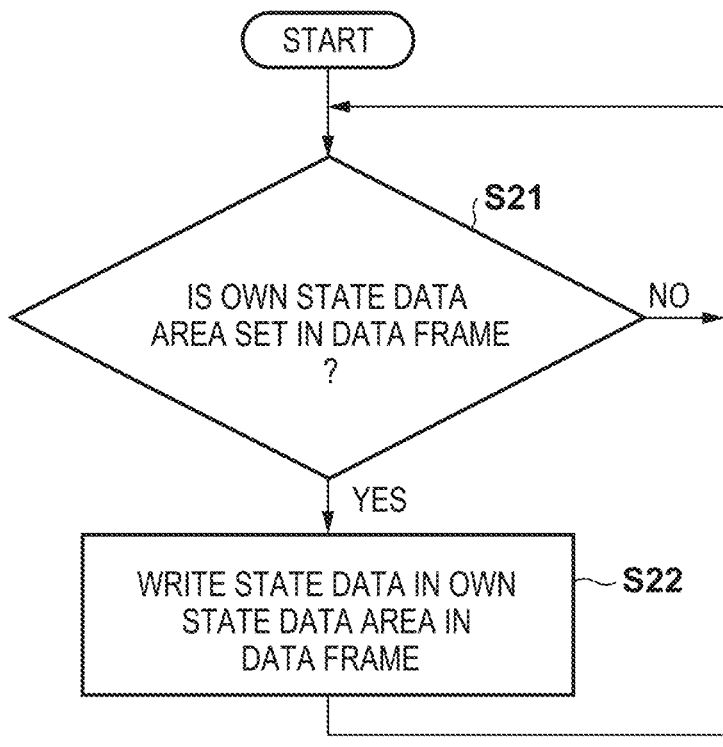

F I G. 15
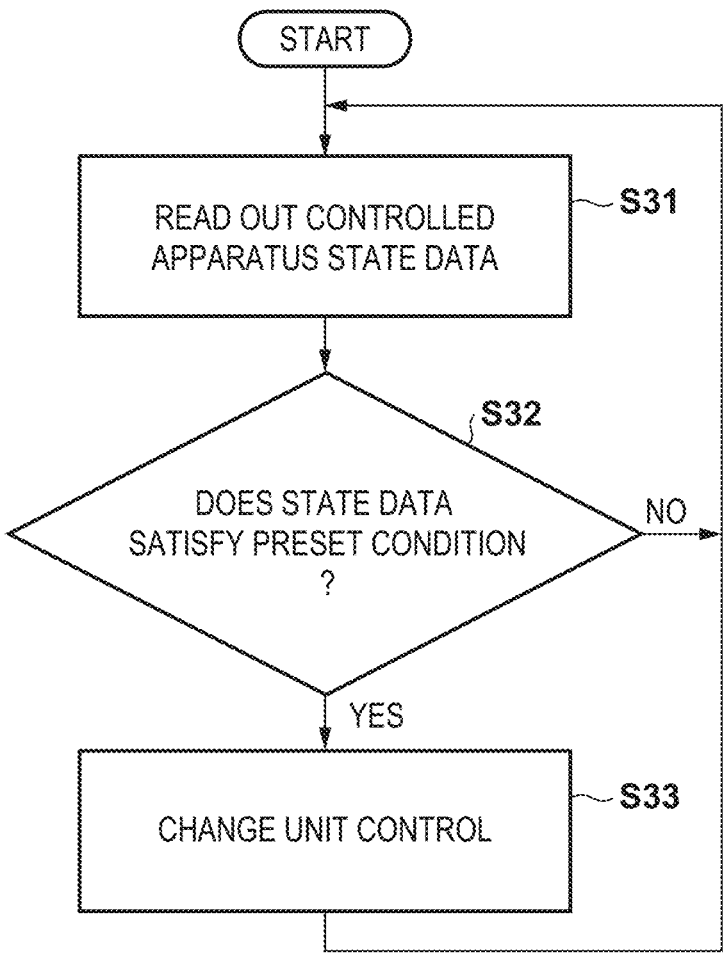

F I G. 16
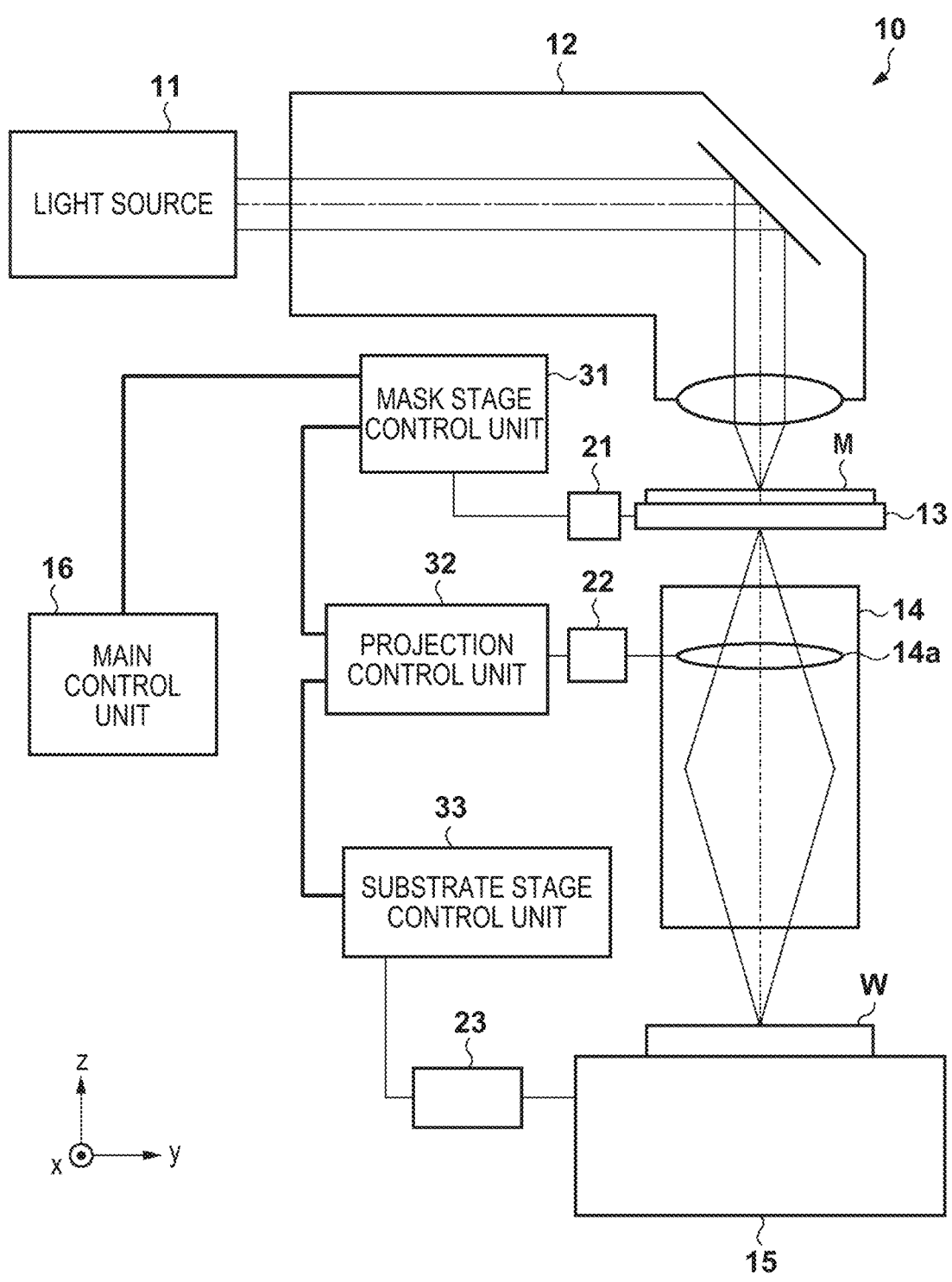

CONTROL APPARATUS, CONTROL METHOD, STORAGE MEDIUM, CONTROL SYSTEM, LITHOGRAPHY APPARATUS, AND METHOD OF MANUFACTURING ARTICLE

BACKGROUND OF THE INVENTION

Field of the Invention

The present invention relates to a control apparatus, a control method, a storage medium, a control system, a lithography apparatus, and a method of manufacturing an article.

Description of the Related Art

Japanese Patent Laid-Open No. 2022-108621 discloses a technique of transmitting/receiving data concerning abnormality in a unit controlled by a controlled apparatus without any delay while reliably transmitting/receiving control data between a main control apparatus and the controlled apparatus.

A system configured to transmit/receive data between a main control apparatus and a controlled apparatus in a predetermined period is sometimes required to obtain information concerning a unit controlled by the controlled apparatus. In such a case, since data for information of the unit needs to be transmitted/received between the main control apparatus and the controlled apparatus in addition to control data, the volume of data to be transmitted/received per period increases.

When the volume of data to be transmitted/received per period increases, the transmission/reception of data is sometimes not completed in one period (one communication period), and data is sometimes transmitted/received across a plurality of periods. In this case, processing by the controlled apparatus which should be executed within one period normally is executed across a plurality of periods, thus delaying the operation of the system.

SUMMARY OF THE INVENTION

The present invention provides a technique advantageous in suppressing delays in transmission/reception of data between a main control apparatus and a controlled apparatus.

The present invention in its one aspect provides a control apparatus for controlling a plurality of nodes connected to a network, the apparatus including a communication unit configured to transmit/receive, via the network in a predetermined period, a data frame including a plurality of data areas respectively assigned to the nodes, and a setting unit configured to, in a case where a first data area, of the plurality of data areas, which is scheduled as a data area of a first node is unused in a first period, assign the first data area as a data area of a second node different from the first node in the first period, wherein the communication unit is configured to cause the second node to read out, in the first period, response data written in the first data area.

Further features of the present invention will become apparent from the following description of exemplary embodiments (with reference to the attached drawings).

BRIEF DESCRIPTION OF THE DRAWINGS

FIG. 1 is a block diagram exemplifying the configuration of a system;

FIG. 4 is a block diagram exemplifying the configuration of a controlled apparatus;

FIG. 5 is a block diagram exemplifying the functional configuration of a processing unit of the controlled apparatus;

FIG. 6 is a diagram exemplifying the flows of data between the main control apparatus and a plurality of controlled apparatuses;

FIG. 7 is a diagram exemplifying the data areas of data frames;

FIG. 9 is a diagram for explaining an example of writing state data in free spaces;

FIG. 11 is a flowchart exemplifying a process in which the main control apparatus sets a data frame;

FIG. 12 is a diagram for explaining an example of writing state data in unused areas and free areas;

FIG. 13 is a flowchart exemplifying a process in which a controlled apparatus writes state data in a data frame;

FIG. 15 is a flowchart exemplifying a process in which the main control apparatus changes the process on a unit in accordance with the state data of a controlled apparatus; and FIG. 16 is a block diagram exemplifying the configuration of an exposure apparatus.

DESCRIPTION OF THE EMBODIMENTS

Figure 2:
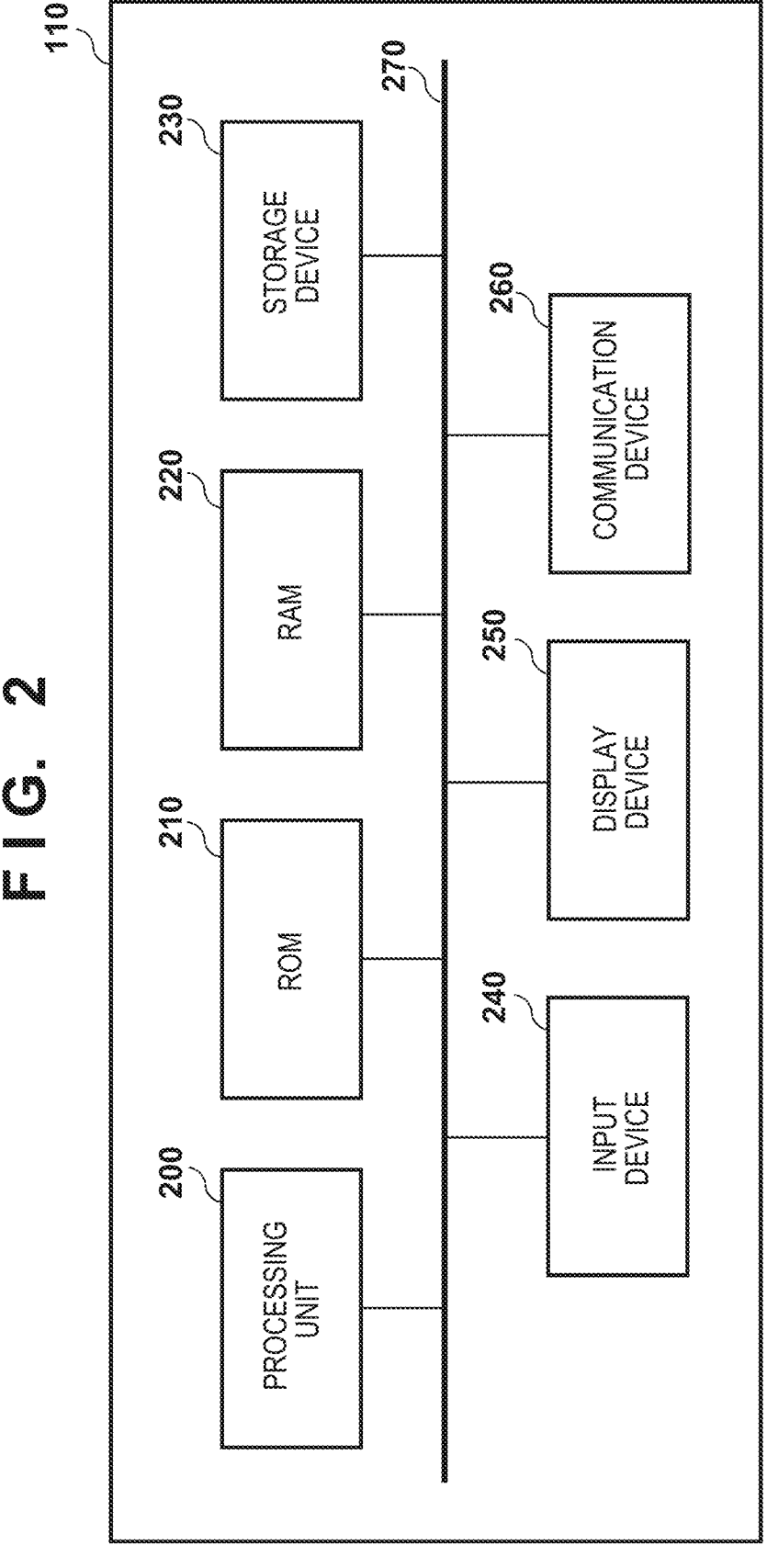
FIG. 2 is a block diagram exemplifying the configuration of a main control apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

First Embodiment (System)

Figure 1:
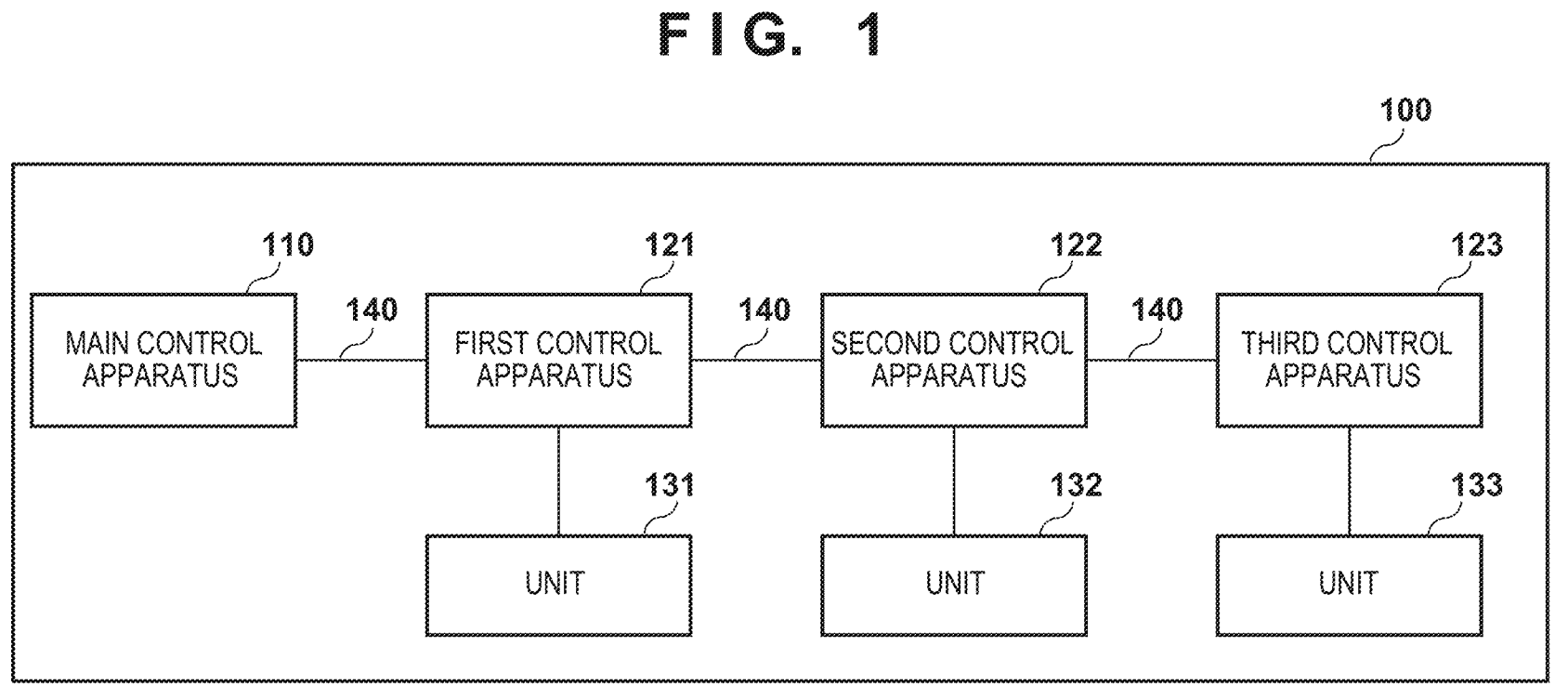

FIG. 1 exemplifies the configuration of a control system 100 as one aspect of the present disclosure. The control system 100 can include a main control apparatus 110, a plurality of controlled apparatuses (a plurality of nodes), and a plurality of units. In the case shown in FIG. 1, the plurality of controlled apparatuses can include a first control apparatus 121, a second control apparatus 122, and a third control apparatus 123. The plurality of units can include a unit 131, a unit 132, and a unit 133. Note, however, that the number of controlled apparatuses and the number of units are not limited to specific numbers. One controlled apparatus can have a form that controls two or more units. Accordingly, the number of units can be equal to or more than the number of control apparatuses.

The first control apparatus 121, the second control apparatus 122, and the third control apparatus 123 are control apparatuses (control nodes) that respectively control the unit 131, the unit 132, and the unit 133. The main control apparatus 110, the first control apparatus 121, and the second control apparatus 122, and the third control apparatus 123 are mutually connected to each other via a network 140. The main control apparatus 110 controls the first control apparatus 121, the second control apparatus 122, and the third control apparatus 123 via the network 140. As described above, the first control apparatus 121, the second control apparatus 122, and the third control apparatus 123 are control apparatuses that respectively control the unit 131, the unit 132, and the unit 133. On the other hand, from the viewpoint of the main control apparatus 110, the first control apparatus 121, the second control apparatus 122, and the third control apparatus 123 each are a controlled apparatus controlled by the main control apparatus 110.

The main control apparatus 110 and the plurality of controlled apparatuses each are implemented by a general-purpose or dedicated computer incorporating programs. Alternatively, the main control apparatus 110 and the plurality of controlled apparatuses each are implemented by a Programmable Logic Device (PLD) such as a Field Programmable Gate Array (FPGA) or an Application Specific Integrated Circuit (ASIC). Alternatively, the main control apparatus 110 and the plurality of controlled apparatuses each are implemented by a combination of all or some of a computer, a PLD, and an ASIC. The plurality of units (the unit 131, the unit 132, and the unit 133) each can be, for example, an element or a component (for example, a relay, a sensor, a servo motor, or an actuator). Alternatively, the plurality of units each can be a module (for example, a positioning mechanism) constituted by a plurality of elements or components or an apparatus constituted by a plurality of modules. Note that a controlled apparatus and a unit controlled by the controlled apparatus may be integrated.

The main control apparatus 110 and the plurality of controlled apparatuses can be connected to form a daisy chain using the network 140. The first control apparatus 121 is arranged between the main control apparatus 110 and the second control apparatus 122 in the daisy chain. The second control apparatus 122 is arranged between the first control apparatus 121 and the third control apparatus 123 in the daisy chain.

FIG. 2 exemplifies the configuration of the main control apparatus 110. The main control apparatus 110 can include a processing unit (processer) 200, a ROM 210, a RAM 220, a storage device 230, an input device 240, a display device 250, and a communication device 260. The processing unit 200 includes a Central Processing Unit (CPU) that operates based on an operating system and an application program. In addition to the Central Processing Unit (CPU), the processing unit 200 may include an additional device such as a Micro Processing Unit (MPU), a Graphics Processing Unit (GPU), or an Application Specific Integrated Circuit (ASIC).

Each of the ROM 210, the RAM 220, and the storage device 230 is a form of a memory. The ROM 210 stores, for example, a program to be executed by the processing unit 200 and permanent data among calculation data. The RAM 220 provides a work area of the processing unit 200 and a temporary storage area for data. The ROM 210 and the RAM 220 are connected to the processing unit 200 via a bus 270. The input device 240 includes a pointing device such as a mouse and a keyboard. The display device 250 provides a function of displaying information. All or part of the input device 240 and the display device 250 may be formed as an integrated device such as a touch panel. The storage device

230 can be, for example, any one or more of hard disk device, a CD, a DVD, and a memory card. The storage device 230 stores a program, data, and the like. The input device 240, the display device 250, and the storage device 230 are connected to the bus 270 via interfaces (not shown), respectively. The communication device 260 functions as a transmitter that transmits data and a receiver that receives data, and, for example, receives response data from a transmitter (not shown) in the controlled device and stores the data in a reception buffer defined in the processing unit 200, the RAM 220, or the storage device 230.

Figure 3:
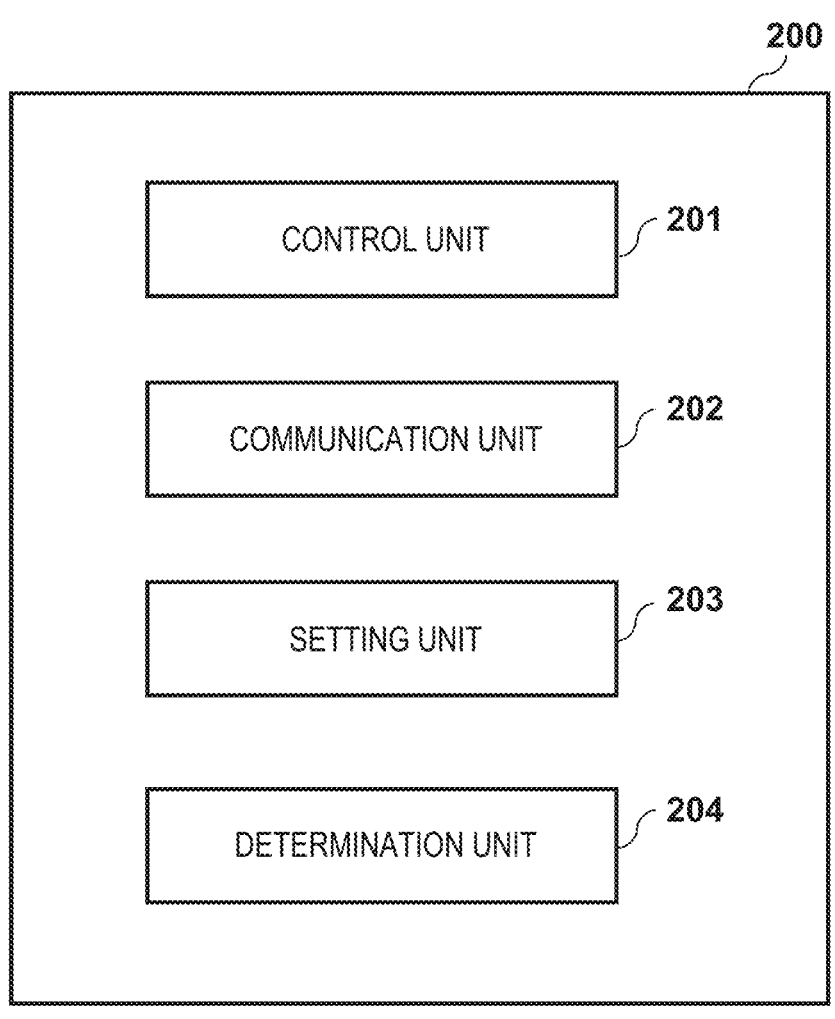
FIG. 3 is a block diagram exemplifying the functional configuration of a processing unit of the main control apparatus.

FIG. 3 exemplifies the functional configuration of the processing unit 200 of the main control apparatus 110. The processing unit 200 includes a control unit 201, a communication unit 202, a setting unit 203, and a determination unit 204. The control unit 201 executes a readout process of reading out response data sent from a controlled apparatus from a reception buffer. In addition, the control unit 201 executes a control process of generating command data for controlling the controlled apparatus based on the response data read out from the reception buffer. The control unit 201 also executes a write process of writing the command data for controlling the controlled apparatus in a transmission buffer.

The communication unit 202 is configured to transmit/receive, via the network 140 in a predetermined period, a data frame including a plurality of data areas respectively assigned to a plurality of controlled apparatuses (nodes). The communication unit 202 controls a transmission process of transmitting command data to the controlled apparatus and a reception process of receiving data such as response data and state data from the controlled apparatus. The communication unit 202 transfers, to the reception buffer, the data extracted from the data frame transmitted from the controlled apparatus to the main control apparatus 110 and received by the communication device 260. In addition, the communication unit 202 transfers data to be transmitted from the main control apparatus 110 to the controlled apparatus from the transmission buffer to the communication device 260 and writes the data in the data frame. The reception buffer and the transmission buffer are areas for temporarily storing data and may be defined in the memory space of the processing unit 200 or defined in the memory space of the RAM 220 or the storage device 230.

The setting unit 203 is configured to set the definitions of a plurality of data areas constituting a data frame based on network configuration information. The network configuration information is created in advance by, for example, the user in the main control apparatus 110 or another information processing apparatus and is stored in the ROM 210 or the storage device 230 of the main control apparatus 110.

The determination unit 204 determines whether the data received from the communication unit 202 satisfies a preset condition. If the determination unit 204 determines that the received data satisfies the condition, a process of changing control on the controlled apparatus is performed. An example of the process of changing the control will be described later.

FIG. 4 exemplifies the arrangement of the first control apparatus 121, the second control apparatus 122, and the third control apparatus 123 (controlled apparatuses). The controlled apparatus can include a processing unit (processor) 300, a ROM 310, a RAM 320, a storage device 330, and a communication device 360. The processing unit 300 includes a Central Processing Unit (CPU) that operates based on an operating system and application programs. The processing unit 300 may include additional devices such as a Micro Processing Unit (MPU), a Graphic Processing Unit (GPU), and an Application Specific Integrated Circuit (ASIC)) in addition to the Central Processing Unit (CPU).

The ROM 310, the RAM 320, and the storage device 330 each are one form of a memory. The ROM 310 stores, for example, programs to be executed by the processing unit 300 and permanent data among operation data. The RAM 320 provides a work area for the processing unit 300 and a storage area for temporarily storing data. The ROM 310 and the RAM 320 are connected to the processing unit 300 via a bus 370. The storage device 330 can be, for example, any one or more of a hard disk drive, a CD, a DVD, a memory card, and the like. The storage device 330 stores programs, data, and the like. The storage device 230 is connected to the bus 370 via an interface (not shown). The communication device 360 functions as a transmission unit that transmits data and a reception unit that receives data.

FIG. 5 exemplifies the configuration of the processing unit 300 of each of the first control apparatus 121, the second control apparatus 122, and the third control apparatus 123 (the controlled apparatuses). The processing unit 300 can include a communication unit 301, a unit control unit 302, and a determination unit 303. The communication unit 301 is configured to transmit/receive a data frame including a plurality of data areas in a predetermined period. The communication unit 301 transmits/receives data such as command data, response data, and state data to/from the main control apparatus 110 via this data frame. Furthermore, the communication unit 301 transmits, to the unit control unit 302, command data received from the main control apparatus 110. The communication unit 301 writes data received from the unit control unit 302 in the data frame, thereby transmitting the data to the main control apparatus 110. The unit control unit 302 controls the corresponding unit (for example, the unit 131 in the case of the unit control unit 302 of the first control apparatus 121) in accordance with the data received from the communication unit 301. The determination unit 303 determines whether the state data area of its own in the data frame.

As an example of the network 140 shown in FIG. 1, EtherCAT® as one Industrial Ethernet® will be described. In EtherCAT®, the main control apparatus 110 connected to the network transmits a data frame to the plurality of controlled devices, and the plurality of controlled devices read/write data from/in the data frame received from the main control apparatus on the fly. At this time, Process Data Object communication (PDO communication) and Service Data Object communication (SDO communication) are used for communication between the main control apparatus and the plurality of controlled devices. PDO communication is communication performed in a predetermined period using data called a Process Data Object (PDO). SDO communication is communication that is performed in response to a request from the main control apparatus to the controlled device using data called a Service Data Object (SDO). In PDO communication, since a data frame is communicated in a predetermined period (for example, every 1 ms), the arrival time of the data is ensured. On the other hand, in SDO communication, since communication is not always completed in one period, the arrival time of the data is not ensured.

If EtherCAT® is adopted as the network 140, among nodes connected to the network 140, at least one node functions as the main control apparatus 110 and the remaining nodes function as the controlled devices. The node functioning as the main control apparatus 110 manages (controls) a timing of communicating a data frame in the network 140 and the like.

In the control system 100 shown in FIG. 1, the main control apparatus 110 writes the command data for the first control apparatus 121, the second control apparatus 122, and the third control apparatus 123 in a data frame of PDO communication, and transmits the data frame to the first control apparatus 121. Upon receiving the data frame from the main control apparatus 110, the first control apparatus 121 reads the command data assigned to the first control apparatus 121 from the command data written in the data frame, and writes response data to the read command data in the data frame. Then, the first control apparatus 121 transmits, to the second control apparatus 122, the data frame in which the response data to the command data assigned to the first control apparatus 121 has been written. Upon receiving the data frame from the first control apparatus 121, the second control apparatus 122 reads the command data assigned to the second control apparatus 122 from the command data written in the data frame, and writes response data to the read command data in the data frame. The second control apparatus 122 reads out the command data assigned to the second control apparatus 122 and writes response data corresponding to the command data in a data frame. Then, the second control apparatus 122 transmits, to the third control apparatus 123, the data frame in which the response data to the command data assigned to the second control apparatus 122 has been written. Upon receiving the data frame from the second control apparatus 122, the third control apparatus 123 reads the command data assigned to the third control apparatus 123 from the command data written in the data frame, and writes response data to the read command data in the data frame. Then, the third control apparatus 123 transmits, to the main control apparatus 110 via the second control apparatus 122 and the first control apparatus 121, the data frame in which the response data to the command data assigned to the third control apparatus 123 has been written.

In the control system 100 configured to transmit/receive data between the main control apparatus and the plurality of controlled apparatuses described above in a predetermined period, the numbers of controlled apparatuses and units tend to increase with the advent of, for example, multi-axis industrial robots with many joints. In this case, a large volume of data (command data and response data) must be transmitted/received between the main control apparatus 110 and a plurality of control apparatuses, and hence the volume of data transmitted/received per period increases. In addition, in order to obtain the state of a unit controlled by a controlled apparatus, it is necessary to transmit/receive state data indicating information concerning the state of the unit between the main control apparatus 110 and a plurality of controlled apparatuses in addition to command data and response data. However, in general, a certain limitation is imposed on the volume of data that can be transmitted/received per period. Accordingly, as the volume of data transmitted/received per period increases, the transmission/reception of data is not completed within one period (one communication period), and hence data is transmitted/received across a plurality of periods. In this case, a control process for a controlled apparatus which should be executed in one period is executed across a plurality of periods (that is, one command data is transmitted upon being divided into a plurality of periods), resulting in a delay in the operation of the control system 100. Such a delay in the operation of the control system 100 becomes noticeable especially when state data indicating information concerning such state of a unit needs to be transmitted from the controlled apparatus to the main control apparatus 110 to obtain the state of the unit. (Use of Free Space)

A control method of controlling a plurality of controlled apparatuses (a plurality of nodes) using the main control apparatus 110 will be described with reference to FIG. 6. FIG. 6 exemplifies the flows of data in communication between the main control apparatus 110 and a plurality of controlled apparatuses. The case in FIG. 6 exemplifies five controlled apparatuses (the first control apparatus 121, the second control apparatus 122, the third control apparatus 123, a fourth control apparatus 124, and a fifth control apparatus 125) as the controlled apparatuses communicably connected to the main control apparatus 110. Note that the number of controlled apparatuses is not limited to five and may be, for example, six or more.

Communication between the main control apparatus and the plurality of controlled apparatuses will be described first. This communication step is a step of transmitting/receiving, via the network 140 in a predetermined period, a data frame including a plurality of data areas assigned to each of the controlled apparatuses (nodes).

In the first period process, the control unit 201 of the main control apparatus 110 transmits command data concerning the first control apparatus 121, the second control apparatus 122, the third control apparatus 123, the fourth control apparatus 124, and the fifth control apparatus 125 to the communication unit 202. The communication unit 202 of the main control apparatus 110 transmits a data frame to the first control apparatus 121 via the network 140 (step S101). The communication unit 301 of the first control apparatus 121 reads out the command data assigned to itself from the command data written in the data frame, receives response data corresponding to the command data from the unit control unit 302, and writes the data in a data frame. The communication unit 301 of the first control apparatus 121 transmits, to the second control apparatus 122, the data frame in which the response data corresponding to the command data assigned to itself is written (step S102). In addition, the communication unit 301 of the first control apparatus 121 transmits such command data to the unit control unit 302.

The communication unit 301 of the second control apparatus 122 which has received a data frame from the first control apparatus 121 reads out the command data assigned to itself from the command data written in the data frame. Thereafter, the communication unit 301 of the second control apparatus 122 receives the response data corresponding to the read command data from the unit control unit 302 and writes the data in a data frame. The communication unit 301 of the second control apparatus 122 transmits, to the third control apparatus 123, the data frame in which the response data corresponding to the command data assigned to itself is written (step S103). In addition, the communication unit 301 of the second control apparatus 122 transmits such command data to the unit control unit 302.

The communication unit 301 of the third control apparatus 123 which has received the data frame from the second control apparatus 122 reads out the command data assigned to itself from the command data written in the data frame. Thereafter, the communication unit 301 of the third control apparatus 123 receives the response data corresponding to the read command data from the unit control unit 302 and writes the data in a data frame. The communication unit 301 of the third control apparatus 123 then transmits, to the fourth control apparatus 124, the data frame in which the response data corresponding to the command data assigned to itself is written (step S104). In addition, the communication unit 301 of the third control apparatus 123 transmits such command data to the unit control unit 302.

The communication unit 301 of the fourth control apparatus 124 which has received the data frame from the third control apparatus 123 reads out the command data assigned to itself from the command data written in the data frame. Thereafter, the communication unit 301 of the fourth control apparatus 124 receives the response data corresponding to the read command data from the unit control unit 302 and writes the data in a data frame. The communication unit 301 of the fourth control apparatus 124 transmits, to the fifth control apparatus 125, the data frame in which the response data corresponding to the command data assigned to itself is written (step S105). In addition, the communication unit 301 of the fourth control apparatus 124 transmits such command data to the unit control unit 302.

The communication unit 301 of the fifth control apparatus 125 which has received a data frame from the fourth control apparatus 124 reads out the command data assigned to itself from the command data written in the data frame. Thereafter, the communication unit 301 of the fifth control apparatus 125 receives response data corresponding to the read command data from the unit control unit 302 and writes the data in the data frame. The communication unit 301 of the fifth control apparatus 125 transmits, to the main control apparatus 110, the data frame in which the response data corresponding to the command data assigned to itself is written. This transmission is performed via the fourth control apparatus 124, the third control apparatus 123, the second control apparatus 122, and the first control apparatus 121 (steps S106, S107, S108, S109, and S110). In addition, the communication unit 301 of the fifth control apparatus 125 transmits such command data to the unit control unit 302.

The communication unit 202 of the main control apparatus 110 reads out the response data of the first control apparatus 121, the second control apparatus 122, the third control apparatus 123, the fourth control apparatus 124, and the fifth control apparatus 125 which are written in the data frame and transmits the data to the control unit 201.

Subsequently, the second period process is executed. Since steps S111 to S120 in the second period process are the same as steps S101 to S110 in the first period process, a description of the process will be omitted.

Data frames to be transmitted/received via the network 140 will be described with reference to FIG. 7. FIG. 7 exemplifies the data areas of data frames transmitted from the main control apparatus 110 to the first control apparatus 121, the second control apparatus 122, the third control apparatus 123, the fourth control apparatus 124, and the fifth control apparatus 125. As exemplified in FIG. 7, the data frame in the first period is assigned with the data areas of the first control apparatus 121, the second control apparatus 122, and the third control apparatus 123. The data areas of the fourth control apparatus 124 and the fifth control apparatus 125 are not assigned to the data frame in the first period. Likewise, the data areas of the first control apparatus 121, the second control apparatus 122, and the third control apparatus 123 are assigned to each of the data frame in the second period and the data frame in the third period. However, the data areas of the fourth control apparatus 124 and the fifth control apparatus 125 are also not assigned to the data frame in the second period and the data frame in the third period. Note, however, that space area 1 is ensured in advance in each of the data frames in the first, second, and third periods.

Figure 8:
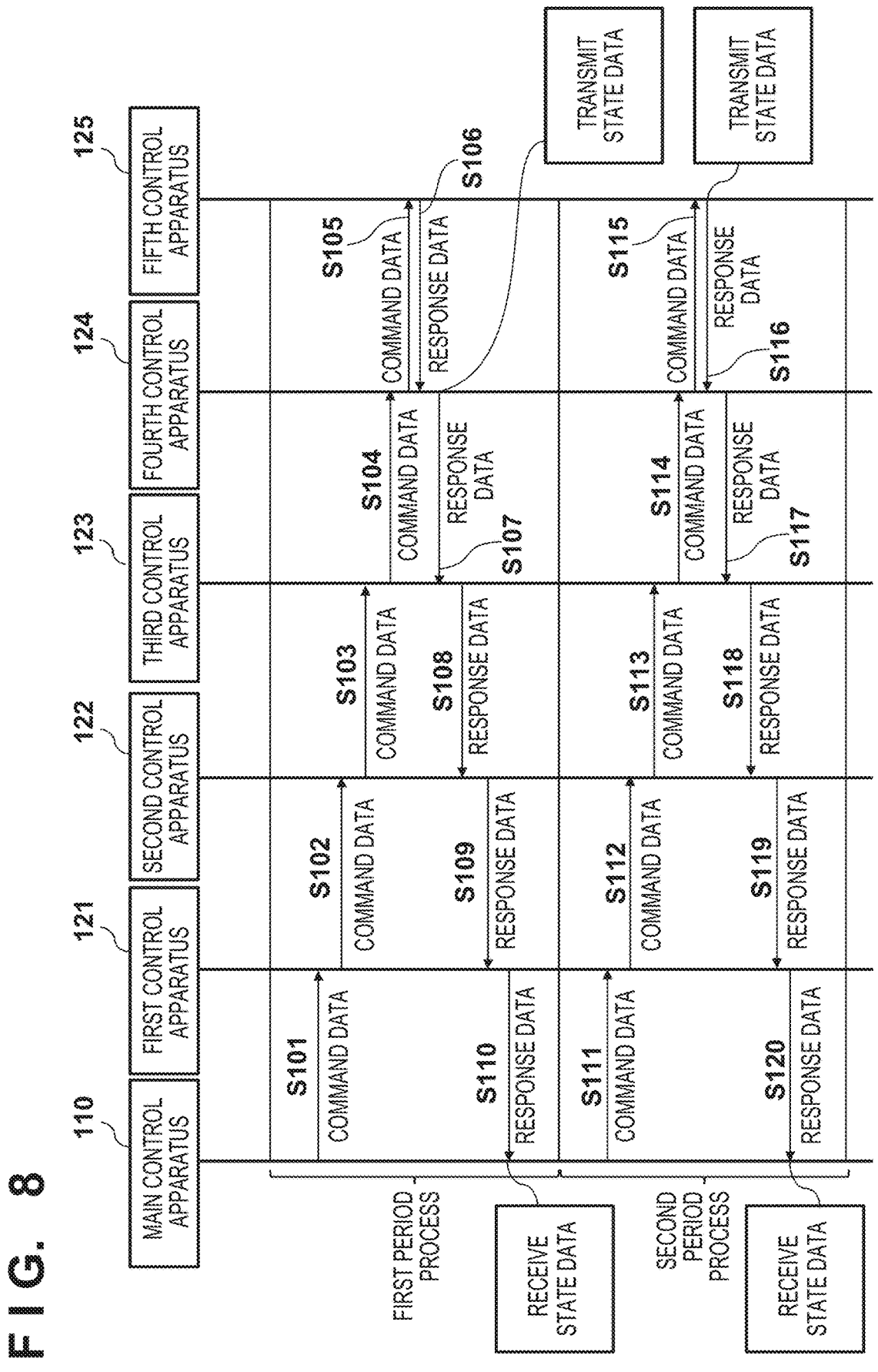
FIG. 8 is a diagram exemplifying the flow of data when the states of units are obtained.

A control method of controlling a plurality of nodes will be described next with reference to FIG. 8. Communication in a case where the state of a unit is obtained will be described hereinafter. FIG. 8 exemplifies the flows of data in communication in a case of obtaining the states of units as control targets for the fourth control apparatus 124 and the fifth control apparatus 125. Since the flows of data in communication between the main control apparatus and a plurality of controlled apparatuses are the same as those in FIG. 6, a detailed description of them will be omitted. FIG. 9 exemplifies the data areas of data frames in a case of obtaining the states of units. In the first period process, the state data of the fourth control apparatus 124 (second node) and the state data of the fifth control apparatus 125 (third node) are transmitted to the main control apparatus 110. In this case, the state data of the fourth control apparatus 124 and the state data of the fifth control apparatus 125 are preferably written in space areas 1 of the respective data frames. As shown in FIG. 9, the total size of the state data of the fourth control apparatus 124 and the state data of the fifth control apparatus 125 is larger than the size of space area 1 of the data frame in the first period, and hence both the data cannot be written in space area 1 within one period. Accordingly, in a first period process, only the fourth control apparatus 124 writes the state data of its own in space area 1 of the data frame. The communication unit 301 of the fourth control apparatus 124 then transmits, to the main control apparatus 110 via the third control apparatus 123, the second control apparatus 122, and the first control apparatus 121, the data frame in which the state data of its own is written (steps S107, S108, S109, and S110). Thereafter, in a second period process, the fifth control apparatus 125 writes the state data of its own in space area 1 of the data frame. The communication unit 301 of the fifth control apparatus 125 then transmits, to the main control apparatus 110, the data frame in which the state data of its own is written. This transmission is performed via the fourth control apparatus 124, the third control apparatus 123, the second control apparatus 122, and the first control apparatus 121 (steps S116, S117, S118, S119, and S120).

In order to obtain the state of each unit in this manner, space area 1 of a data frame can be used. If the size of state data to be obtained is larger than that of space area 1, communication is not completed within one period, and a plurality of periods are required.

(Use of Unused Area in Data Area)

Figure 10:
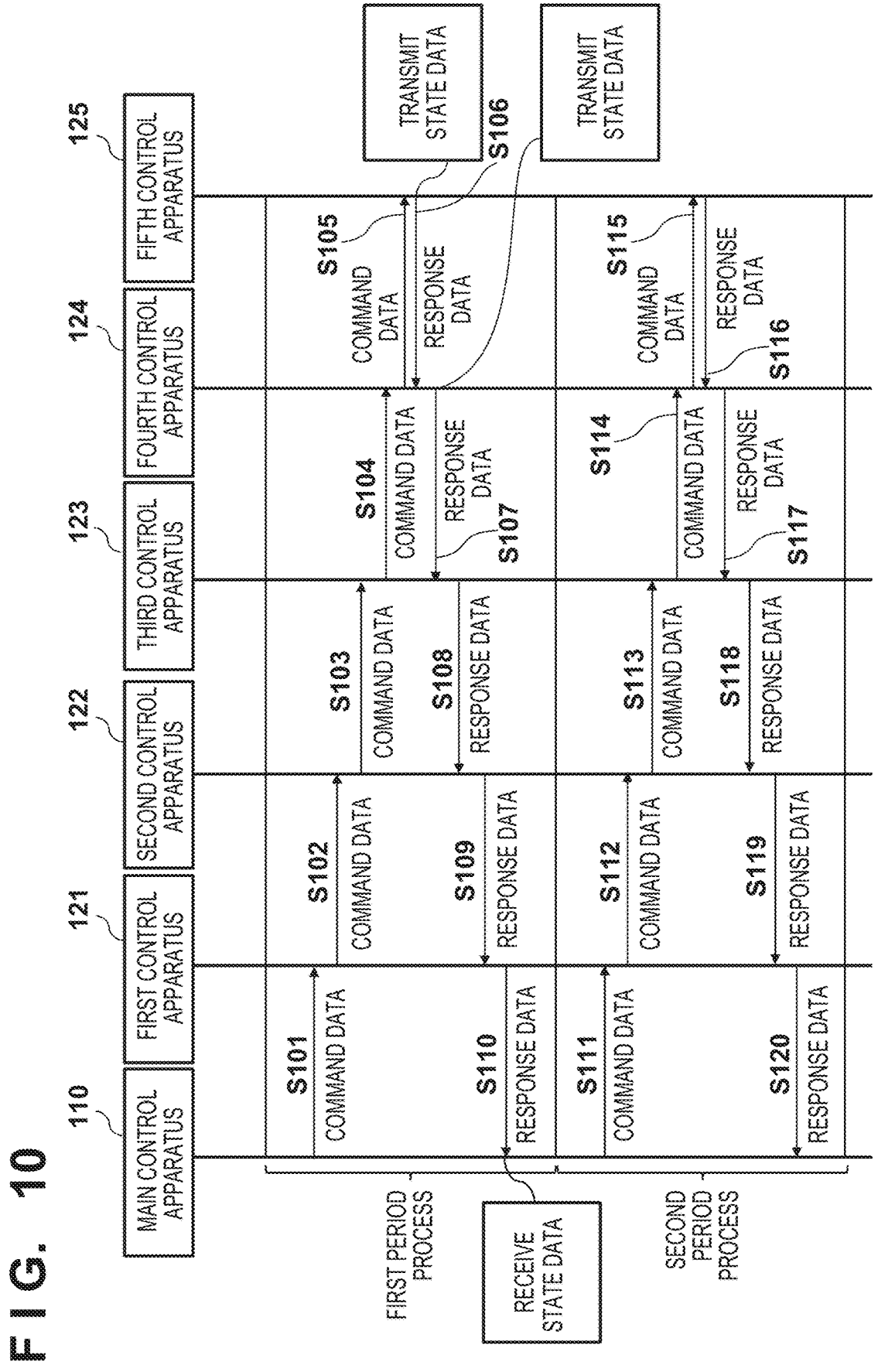
FIG. 10 is a diagram exemplifying the flows of data when the states of units are obtained.

FIG. 10 exemplifies the flows of data in communication in a case where the main control apparatus 110 obtains the states of units. Since the flows of data in communication 110 between the main control apparatus and a plurality of controlled apparatuses are the same as those in FIG. 6, a detailed description of them will be omitted. Assume in this case that the main control apparatus 110 controls the first control apparatus 121 and the third control apparatus 123 and obtains the state data of the fourth control apparatus 124 and the fifth control apparatus 125 in the first period, and that the main control apparatus 110 controls the second control apparatus 122 in the second period. FIG. 10 exemplifies the flows of the respective data in this case. As described in detail below, in the first period, the state data of the fifth control apparatus 125 is written in space area 1 (step S106), and the state data of the fourth control apparatus 124 is written in an unused area different from space area 1 (step S107).

FIG. 11 is a flowchart exemplifying a process in which the main control apparatus 110 sets a data frame in the communication step in FIG. 10. The processing unit 200 (each unit of which) executes each step in the flowchart in FIG. 11. In step S11, the control unit 201 determines whether to control a controlled apparatus, that is, to transmit command data to the controlled apparatus. This determination is performed by, for example, determining whether the timing of transmitting command data to the controlled apparatus has been met. If the control unit 201 determines in step S11 that the timing of transmitting command data to the controlled apparatus has been met, the process advances to step S12. In step S12, the control unit 201 writes command data for controlling the controlled apparatus in the transmission buffer. Thereafter, the process returns to step S11. If the control unit 201 determines in step S11 that the timing of transmitting the command data to the controlled apparatus has not been met, the process advances to step S13. In step S13, the setting unit 203 sets a data area of the controlled apparatus in the data frame as a state data area of another controlled apparatus that obtains the state of a unit. Thereafter, the process returns to step S11.

In step S13, the setting unit 203 may determine the state data area of a specific controlled apparatus in which the data area of the controlled apparatus in the data frame is to be set, based on the sampling rate of the state data of each control node (controlled apparatus). In this case, the sampling rate indicates the sampling period of a sensor when, for example, a sensor value is obtained as state data. For example, the setting unit 203 can preferentially set a controlled apparatus that obtains a sensor value having a high sampling rate as a target of a state data area.

In addition, the setting unit 203 may determine the state data area of a specific controlled apparatus in which the data area of the controlled apparatus in the data frame is set, based on the operation state of each of a plurality of controlled apparatuses (a plurality of nodes). For example, the setting unit 203 can preferentially set the controlled apparatus in operation as a target of a state data area.

In addition, the setting unit 203 may determine the state data area of a specific controlled apparatus in which the data area of the controlled apparatus of a data frame is set, based on the command data transmitted to the controlled apparatus by the main control apparatus 110. For example, the setting unit 203 can preferentially set, as a target of a state data area, a controlled apparatus to which operation command data is transmitted.

Data frames transmitted/received via the network 140 will be described with reference to FIG. 12. FIG. 12 exemplifies the data areas of the data frames transmitted from the main control apparatus 110 to the first control apparatus 121, the second control apparatus 122, the third control apparatus 123, the fourth control apparatus 124, and the fifth control apparatus 125 in each period. Assume in this case that the main control apparatus 110 controls the first control apparatus 121 and the third control apparatus 123 in the first period, controls the second control apparatus 122 in the second period, and controls the second control apparatus 122 and the third control apparatus 123 in the third period.

The data frame in the first period is originally assigned with the data areas of the first control apparatus 121, the second control apparatus 122, and the third control apparatus 123 and has space area 1. In this case, however, since the main control apparatus 110 does not control the second control apparatus 122 in the first period, the data area of the second control apparatus 122 in the data frame is unused, and unused area 1 exists, as shown in FIG. 12.

In addition, the data frame in the second period is originally assigned with the data areas of the first control apparatus 121, the second control apparatus 122, and the third control apparatus 123 and has space area 1. In this case, however, in the second period, the main control apparatus 110 does not control the first control apparatus 121 and the third control apparatus 123. Accordingly, the data areas of the first control apparatus 121 and the third control apparatus 123 in the data frame are unused, and hence unused areas 1 and 2 exist, as shown in FIG. 12.

Likewise, the data frame in the third period is assigned with the data areas of the first control apparatus 121, the second control apparatus 122, and the third control apparatus 123 and has space area 1. In this case, however, in the third period, since the main control apparatus 110 does not control the first control apparatus 121, the data area of the first control apparatus 121 is unused, and unused area 1 exists.

In the first period process, the main control apparatus 110 assigns unused area 1 which is originally the data area of the second control apparatus 122 and space area 1 as the data areas of the fourth control apparatus 124 and the fifth control apparatus 125, respectively. In accordance with this assignment, the fourth control apparatus 124 writes state data in unused area 1, and the fifth control apparatus 125 writes state data in space area 1.

In the second period process, the main control apparatus 110 assigns unused areas 1 and 2 that are originally the data areas of the first control apparatus 121 and the third control apparatus 123 as the data areas of the fourth control apparatus 124 and the fifth control apparatus 125, respectively. In accordance with this assignment, the fourth control apparatus 124 writes state data in unused area 1, and the fifth control apparatus 125 writes state data in unused area 2.

In the third period process, the main control apparatus 110 assigns unused area 1 that is originally the data area of the first control apparatus 121 and space area 1 as the data areas of the fourth control apparatus 124 and the fifth control apparatus 125, respectively. In accordance with this assignment, the fourth control apparatus 124 writes state data in unused area 1, and the fifth control apparatus 125 writes state data in space area 1.

As described above, in this embodiment, the setting unit 203 performs dynamic assignment in a case where the first data area (unused area 1 or 2) of the plurality of data areas which is scheduled as the data area of the first node (one of the controlled apparatuses) is unused in the first period. More specifically, in the first period, the setting unit 203 assigns the first data area as the data area of the second node (for example, the fourth control apparatus) different from the first node (for example, the second control apparatus). In addition, at this time, the setting unit 203 can assign space area 1 as the data area of the third node (for example, the fifth control apparatus) which is different from the first and second nodes.

FIG. 13 is a flowchart exemplifying a process in which a controlled apparatus writes state data in a data frame. The processing unit 300 (each unit of which) executes each step in the flowchart in FIG. 13. In step S21, the determination unit 303 determines whether a state data area of its own is set in the data frame received from the main control apparatus 110. More specifically, the data frame is provided with a flag indicating that a state data area is set for each controlled apparatus. If the flag is set in the data frame, the determination unit 303 determines whether the state data area of its own is set in the data frame. In contrast, if the flag is not set in the data frame, the determination unit 303 can determine that the state data area of its own is not set in the data frame. In step S21, if the determination unit 303 determines that the state data area of its own is set in the received data frame, the process advances to step S22. In step S22, the unit control unit 302 obtains the state data of the unit and writes state data in the state data area of its own set in the data frame. Thereafter, the process returns to step S21. In contrast, if the determination unit 303 determines that the state data area of its own is not set in the received data frame, the process returns to step S21.

As described above, according to this embodiment, in communication between the main control apparatus and a plurality of controlled apparatuses, it is possible to assign not only a space area in a data frame but also an unused area in a data area as data areas of each controlled apparatus from which a state is to be obtained. This makes it possible to reduce the number of periods required for communication. Therefore, this embodiment is advantageous in suppressing delays in transmission/reception of data between the main control apparatus and a plurality of controlled apparatuses.

Second Embodiment

The second embodiment will be described next. Note that matters that are not referred to here can comply with the first embodiment. In the second embodiment, a main control apparatus 110 receives the state data of a controlled apparatus and changes the process for a unit of another controlled apparatus in accordance with the state data.

Figure 14:
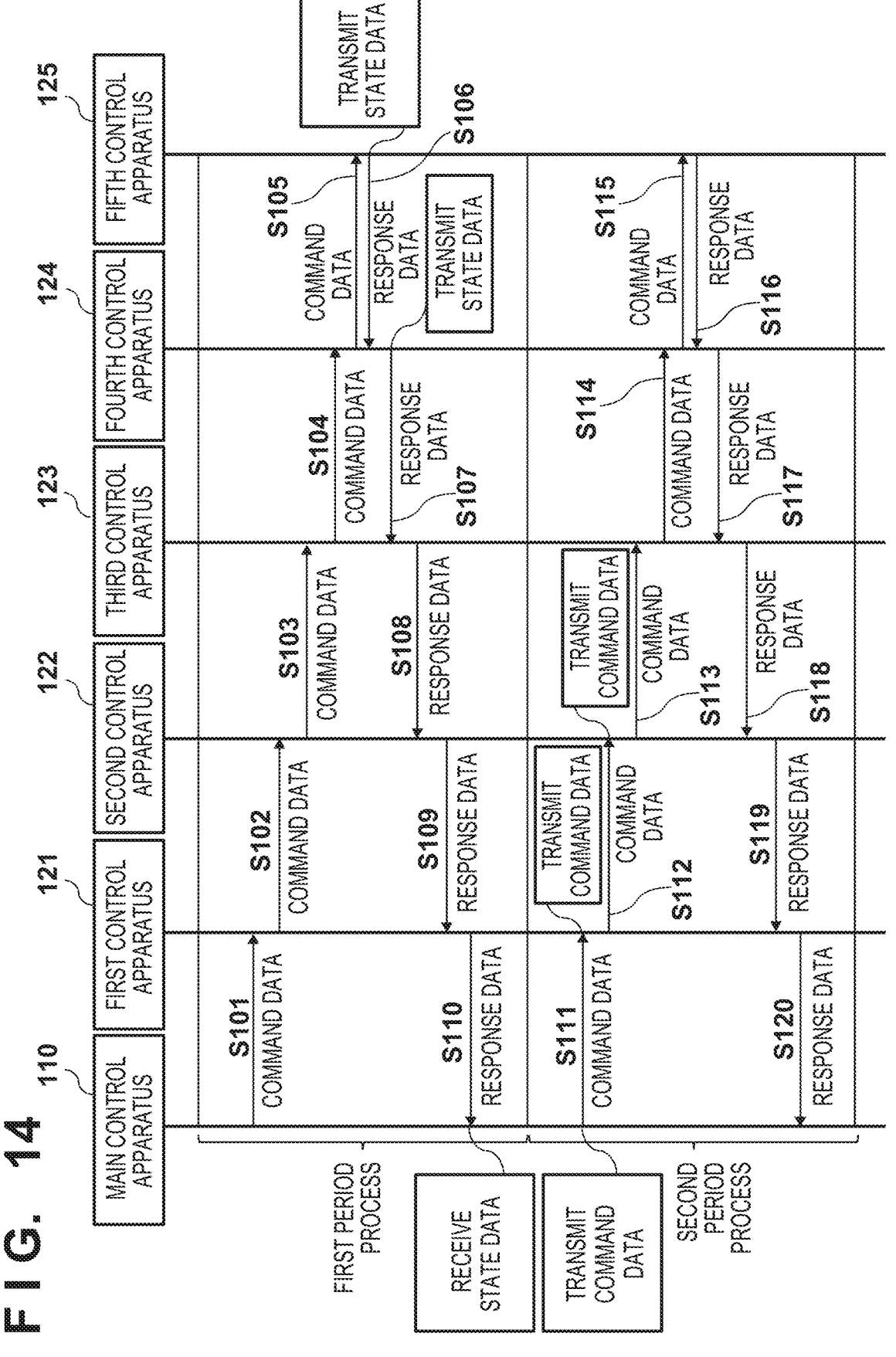
FIG. 14 is a diagram exemplifying the flows of data when the states of units are obtained.

FIG. 14 exemplifies the flows of data in communication in a case wherein the main control apparatus 110 obtains the states of units. Note that since the flows of data in communication between the main control apparatus 110 and a plurality of controlled apparatuses are the same as those in FIG. 6, a detailed description of them will be omitted. Assume in this case that the following control process is performed. First of all, in the first period, the main control apparatus 110 controls a first control apparatus 121 and a third control apparatus 123 and obtains the state data of a fourth control apparatus 124 and a fifth control apparatus 125. In the second period, the main control apparatus 110 controls the first control apparatus 121 and a second control apparatus 122 based on the state data obtained in the first period. FIG. 14 exemplifies the flow of each data in this case. Referring to FIG. 14, as in FIG. 10, in the first period, the state data of the fifth control apparatus 125 is written in space area 1 (step S106), and the state data of the fourth control apparatus 124 is written in an unused area different from space area 1 (step S107).

FIG. 15 is a flowchart showing a process in a case where the main control apparatus 110 changes the process for the unit of a controlled apparatus in accordance with the state data of the controlled apparatus. A processing unit 200 (each unit of which) executes each step in the flowchart in FIG. 15. In step S31, a communication unit 202 reads out the state data of the controlled apparatus which is written in an area assigned as the data area of the controlled apparatus from the data frame received from the controlled apparatus.

In step S32, a determination unit 204 determines whether the state data of the controlled apparatus which is read out in step S31 satisfies a preset condition. If the determination unit 204 determines in step S32 that the state data satisfies the condition, the process advances to step S33. In step S33, a control unit 201 transmits command data generated based on preset control data to a controlled apparatus that changes control on the unit. Thereafter, the process returns to step S31. In contrast, if the determination unit 204 determines in step S32 that the state data does not satisfy the condition, the process returns to step S31.

In the first period process, the communication unit 202 of the main control apparatus 110 reads out, from the data frame received from the first control apparatus 121, the state data written in areas assigned as the state data areas of the fourth control apparatus 124 and the fifth control apparatus 125. The communication unit 202 then transmits the state data to the determination unit 204. The determination unit 204 determines whether the state data satisfies the preset condition. In the case shown in FIG. 14, since the determination unit 204 determines that the state data satisfies the preset condition, the determination unit 204 transmits the preset control data to the control unit 201. The control unit 201 then executes a control process of generating command data for controlling the first control apparatus 121 based on the preset control data. In addition, the control unit 201 writes the command data for controlling the first control apparatus 121 in the transmission buffer. In this manner, the main control apparatus 110 can transmit command data for changing the control on the unit in accordance with the state data read out from the state data area.

In the first control apparatus 121, a communication unit 301 transmits the command data received from the main control apparatus 110 to a unit control unit 302. The unit control unit 302 changes the process for the corresponding unit in accordance with the data received from the communication unit 301.

In addition, the unit control unit 302 may stop the operation of a controlled apparatus including a unit as a control process. The unit control unit 302 may also cause a display device 250 of the main control apparatus 110 to display information concerning an occurring abnormality as an abnormality process. In this case, the information concerning the abnormality can include information concerning a message informing the occurrence of the abnormality, the contents or cause of the abnormality that has occurred, a coping method, or the like.

As described above, according to this embodiment, in communication between the main control apparatus and a plurality of controlled apparatuses, not only a space area of a data frame but also an unused area in a data area can be assigned as data areas of a controlled area from which a state is to be obtained. This makes it possible to reduce periods required for communication. Accordingly, the embodiment is advantageous in controlling delays in transmission/reception between the main control apparatus and controlled apparatuses. In addition, in accordance with the state data of a controlled apparatus, the control on another controlled apparatus can be quickly changed.

<Embodiment of Substrate Processing Apparatus>

An embodiment of a substrate processing apparatus to which the control system 100 is applied will be described. This embodiment exemplifies an exposure apparatus that forms a pattern on a substrate by exposing the substrate to light as a substrate processing apparatus to which the control system 100 is applied. However, this is not exhaustive. For example, the control system 100 can be applied to substrate processing apparatuses such as an imprint apparatus that forms a pattern on an imprint material on a substrate by using a mold and a drawing apparatus that forms a pattern on a substrate by irradiating the substrate with charged particle radiation. The control system 100 can also be applied to substrate processing apparatuses, as substrate processing apparatuses to which the control system 100 is applied, such as a coating apparatus that coats the surface of a substrate with a photosensitive medium and a developing apparatus that develops a substrate onto which a pattern is transferred. In addition, as substrate processing apparatuses to which the control system 100 is applied, the control system 100 can be applied to substrate processing apparatuses such as a deposition apparatus (CVD apparatus or the like), a processing apparatus (laser processing apparatus or the like), and an inspection apparatus (overlay detection apparatus or the like).

FIG. 16 is a view showing the configuration of an exposure apparatus 10 as a substrate processing apparatus. The exposure apparatus 10 exemplifies an exposure apparatus that projects the pattern of a mask M onto a substrate W through a projection optical system 14 and exposes the substrate W to light. The exposure apparatus 10 includes a light source 11, an illumination optical system 12, a mask stage 13, the projection optical system 14, a substrate stage 15, and a main control unit 16. In addition, the exposure apparatus 10 includes a first driving unit 21 that drives the mask stage 13, a second driving unit 22 that drives a lens 14a of the projection optical system 14, and a third driving unit 23 that drives the substrate stage 15. The first driving unit 21, the second driving unit 22, and the third driving unit 23 each are a mechanism that performs at least part of a process of forming a pattern on the substrate W. Such mechanism is controlled by a mask stage control unit 31, a projection control unit 32, and a substrate stage control unit 33. In addition, the main control unit 16 includes, for example, a CPU (processing unit) and a storage device and controls the overall exposure apparatus 10 (each unit of the exposure apparatus 10) by controlling the mask stage control unit 31, the projection control unit 32, and the substrate stage control unit 33.

The light source 11 emits exposure light. The illumination optical system 12 illuminates the mask M with light emitted from the light source 11. The mask stage 13 can be configured to hold the mask M and move in, for example, the X and Y directions with the first driving unit 21. The projection optical system 14 projects the pattern of the mask M illuminated by the illumination optical system 12 onto a substrate. The projection optical system 14 includes the lens 14a that can move in, for example, the X and Y directions with the second driving unit 22. The substrate stage 15 can be configured to hold the substrate W and move in, for example, the X and Y directions with the third driving unit 23.

When the control system 100 is applied to the exposure apparatus 10 shown in FIG. 16, the main control unit 16 can be configured as the main control apparatus 110. In addition, the mask stage control unit 31, the projection control unit 32, the substrate stage control unit 33, and a substrate stage monitoring unit 34 each can be configured as a controlled apparatus. The first driving unit 21, the second driving unit 22, and the third driving unit 23 can be respectively configured as units (corresponding to the unit 131, the unit 132, and the unit 133 described above). Communication between the main control unit 16, the mask stage control unit 31, the projection control unit 32, the substrate stage control unit 33, and the substrate stage monitoring unit 34 is performed in a preset period via a network 140.

The following is a description of a case where the main control apparatus 110 communicates with the mask stage control unit 31, the projection control unit 32, the substrate stage control unit 33, and the substrate stage monitoring unit 34 as an example of a case where the control system 100 is applied to the exposure apparatus 10. The control unit 201 performs, for example, a control process of generating command data for controlling the mask stage control unit 31, the projection control unit 32, and the substrate stage control unit 33.

The communication unit 202 transmits the command data written in the transmission buffer by the control unit 201 to the mask stage control unit 31, the projection control unit 32, and the substrate stage control unit 33 in a predetermined period. The communication unit 202 receives response data corresponding to such command data from the mask stage control unit 31, the projection control unit 32, and the substrate stage control unit 33. The communication unit 202 further receives the state data of the substrate stage 15 from the substrate stage monitoring unit 34.

In addition, the determination unit 204 of the main control apparatus 110 receives the state data of the substrate stage 15 via the substrate stage monitoring unit 34 within one period. The state data can include, for example, data indicating a state where an abnormality has occurred in the substrate stage 15. The determination unit 204 of the main control apparatus 110 quickly changes the control on the substrate stage in accordance with the state data of the substrate stage 15.

As described above, the control system 100 according to this disclosure is applied to a substrate processing apparatus such as an exposure apparatus. This makes it possible to effectively suppress delays in data transmission/reception between the substrate processing apparatus and a plurality of controlled apparatuses.

<<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a latent image pattern on a photosensitive agent applied on a substrate using the above-described exposure apparatus (a step of exposing a substrate to light) and a step of developing the substrate on which the latent image pattern is formed in the former step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared to a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., Application Specific Integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., Central Processing Unit (CPU), Micro Processing Unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a Random-Access Memory (RAM), a Read Only Memory (ROM), a storage of distributed computing systems, an optical disk (such as a Compact Disc (CD), Digital Versatile Disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-100268, filed Jun. 19, 2023, which is hereby incorporated by reference herein in its entirety.

What is claimed is:

1. A control apparatus for controlling a plurality of nodes connected to a network, the apparatus comprising:
   a communication unit configured to transmit and receive, via the network in a predetermined period, a data frame including a plurality of data areas respectively assigned to the nodes; and
   a setting unit configured to define assignments of the plurality of data areas,
   wherein the plurality of nodes include a first node and a second node, the second node being a control node configured to control a first unit, and
   wherein, in a case where a first data area of the plurality of data areas is unused in a first period and is scheduled, in a second period before or after the first period, as a data area in which command data to the first node and response data from the first node are written, the setting unit is configured to assign the first data area, in the first period, as a state data area in which state data indicating a state of the first unit is written by the second node.

2. The apparatus according to claim 1, wherein command data for changing control on the first unit is transmitted in accordance with the state data read out from the state data area.

3. The apparatus according to claim 1, wherein the setting unit is configured to determine the second node from among the plurality of nodes based on a sampling rate at which the second node acquires the state data from the first unit.

4. The apparatus according to claim 1, wherein the setting unit is configured to determine the second node from among the plurality of nodes based on operation states of the plurality of nodes.

5. The apparatus according to claim 1, wherein the setting unit is configured to determine the second node from among the plurality of nodes based on command data to be transmitted.

6. The apparatus according to claim 1, wherein the data frame further includes a space area ensured in advance,
   the plurality of nodes further include a third node configured to control a second unit, and
   the setting unit is configured to further assign the space area as a state data area in which state data indicating a state of the second unit is written by the third node.

7. The apparatus according to claim 6, wherein a total size of state data of the second node and state data of the third node is larger than a size of the space area.

8. The apparatus according to claim 1, wherein the network is a network complying with EtherCAT®.

9. A control method of controlling a plurality of nodes connected to a network, the method comprising transmitting and receiving, via the network in a predetermined period, a data frame including a plurality of data areas respectively assigned to the nodes, and defining assignments of the plurality of data areas, wherein the plurality of nodes include a first node and a second node, the second node being a control node configured to control a first unit, and wherein, in a case where a first data area of the plurality of data areas is unused in a first period and is scheduled, in a second period before or after the first period, as a data area in which command data to the first node and response data from the first node are written, the first data area is assigned, in the first period, as a state data area in which state data indicating a state of the first unit is written by the second node.

10. A non-transitory computer-readable storage medium storing a program for causing a computer to execute transmitting and receiving, via the network in a predetermined period, a data frame including a plurality of data areas respectively assigned to the nodes, and defining assignments of the plurality of data areas, wherein the plurality of nodes include a first node and a second node, the second node being a control node configured to control a first unit, and wherein, in a case where a first data area of the plurality of data areas is unused in a first period and is scheduled, in a second period before or after the first period, as a data area in which command data to the first node and response data from the first node are written, the first data area is assigned, in the first period, as a state data area in which state data indicating a state of the first unit is written by the second node.

11. A control system including a plurality of nodes connected to a network and a control apparatus configured to control the plurality of nodes, wherein the control apparatus includes a communication unit configured to transmit and receive, via the network in a predetermined period, a data frame including a plurality of data areas respectively assigned to the nodes, and a setting unit configured to define assignments of the plurality of data areas, wherein the plurality of nodes include a first node and a second node, the second node being a control node configured to control a first unit, and wherein, in a case where a first data area of the plurality of data areas is unused in a first period and is scheduled, in a second period before or after the first period, as a data area in which command data to the first node and response data from the first node are written, the setting unit is configured to assign the first data area, in the first period, as a state data area in which state data indicating a state of the first unit is written by the second node.

12. A lithography apparatus for forming a pattern on a substrate, the apparatus comprising a control system defined in claim 11, wherein each of a plurality of nodes of the control system controls a unit configured to perform at least part of a process of forming a pattern on the substrate.

13. A method of manufacturing an article, the method comprising:

forming a pattern on a substrate by using a lithography apparatus defined in claim 12;

processing the substrate on which the pattern is formed; and manufacturing an article from the processed substrate.

* * * * *